United States Patent
Nakayama et al.

(10) Patent No.: US 11,756,766 B2
(45) Date of Patent: Sep. 12, 2023

(54) CHARGED PARTICLE BEAM WRITING APPARATUS AND CHARGED PARTICLE BEAM WRITING METHOD

(71) Applicant: NuFlare Technology, Inc., Yokohama (JP)

(72) Inventors: Takahito Nakayama, Chigasaki (JP); Hirofumi Morita, Tokyo (JP)

(73) Assignee: NuFlare Technology, Inc., Yokohama (JP)

(*) Notice: Subject to any disclaimer, the term of this patent is extended or adjusted under 35 U.S.C. 154(b) by 0 days.

(21) Appl. No.: 17/657,959

(22) Filed: Apr. 5, 2022

(65) Prior Publication Data
US 2022/0319807 A1 Oct. 6, 2022

(30) Foreign Application Priority Data
Apr. 5, 2021 (JP) .............................. JP2021-064193

(51) Int. Cl.
*H01J 37/04* (2006.01)
*H01J 37/304* (2006.01)
*H01J 37/317* (2006.01)

(52) U.S. Cl.
CPC ........ *H01J 37/3177* (2013.01); *H01J 37/045* (2013.01); *H01J 37/304* (2013.01); *H01J 2237/0435* (2013.01)

(58) Field of Classification Search
CPC .... H01J 37/043; H01J 37/045; H01J 37/3177; H01J 37/302; H01J 37/304; H01J 2237/31762; H01J 2237/31798; H01J 2237/245; H01J 2237/0435; H01J 2237/20292
See application file for complete search history.

(56) References Cited

U.S. PATENT DOCUMENTS 9,478,391 B2 * 10/2016 Matsumoto ........... H01J 37/147
2013/0078577 A1 * 3/2013 Yamazaki .............. B82Y 40/00
250/252.1

(Continued)

FOREIGN PATENT DOCUMENTS

JP   2013-38397 A    2/2013
JP   2017-195304 A  10/2017

OTHER PUBLICATIONS

Taiwanese Office Action dated Mar. 13, 2023 in Taiwanese Patent Application No. 111111095, with English Translation, total 16 pages (citing reference 15 therein).

*Primary Examiner* — Sean M Luck
(74) *Attorney, Agent, or Firm* — Oblon, McClelland, Maier & Neustadt, L.L.P.

(57) ABSTRACT

According to one embodiment, a charged particle beam writing apparatus includes, a writing mechanism, a writing control circuit, a deflection operation control circuit configured to generate control data for controlling the blanking of each of the charged particle beams based on the shot data, a storage, a blanking control circuit configured to control the blanking based on the control data, and a detector. The writing control circuit is configured to, when the detector detects the abnormality during the writing, interrupt the writing, and generate interrupt position information at a position where the writing is interrupted based on the shot data which has been stored at the storage and is related to the control data that has not been used for controlling the blanking.

13 Claims, 12 Drawing Sheets

(56) References Cited

U.S. PATENT DOCUMENTS

| | | | |
|---|---|---|---|
| 2014/0021655 A1* | 1/2014 | Hirata | B82Y 40/00 |
| | | | 398/208 |
| 2017/0076912 A1* | 3/2017 | Matsumoto | H01J 37/3023 |
| 2017/0352520 A1* | 12/2017 | Matsumoto | H01J 37/3007 |
| 2018/0005799 A1* | 1/2018 | Hasegawa | H01J 37/20 |
| 2018/0166254 A1* | 6/2018 | Matsumoto | H01J 37/3007 |
| 2019/0198293 A1* | 6/2019 | Ogasawara | H01J 37/3177 |
| 2020/0118791 A1* | 4/2020 | Teguri | H01J 37/3177 |
| 2020/0135428 A1* | 4/2020 | Matsumoto | H01J 37/24 |

* cited by examiner

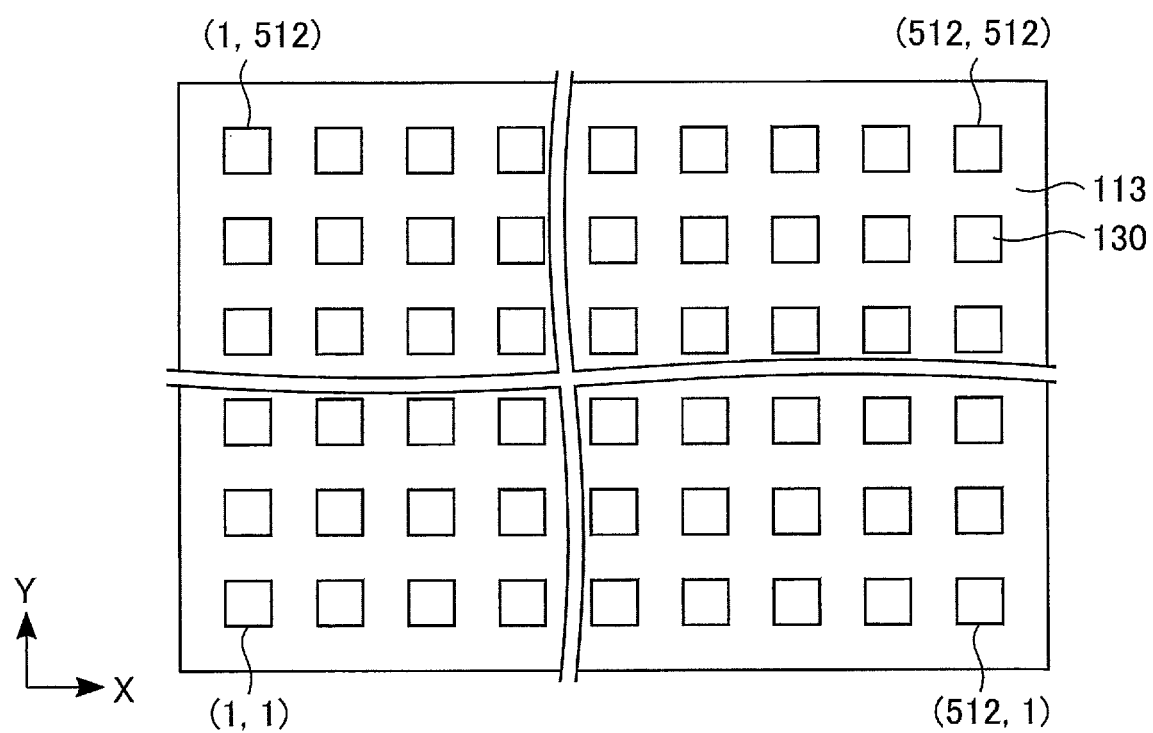
F I G. 2

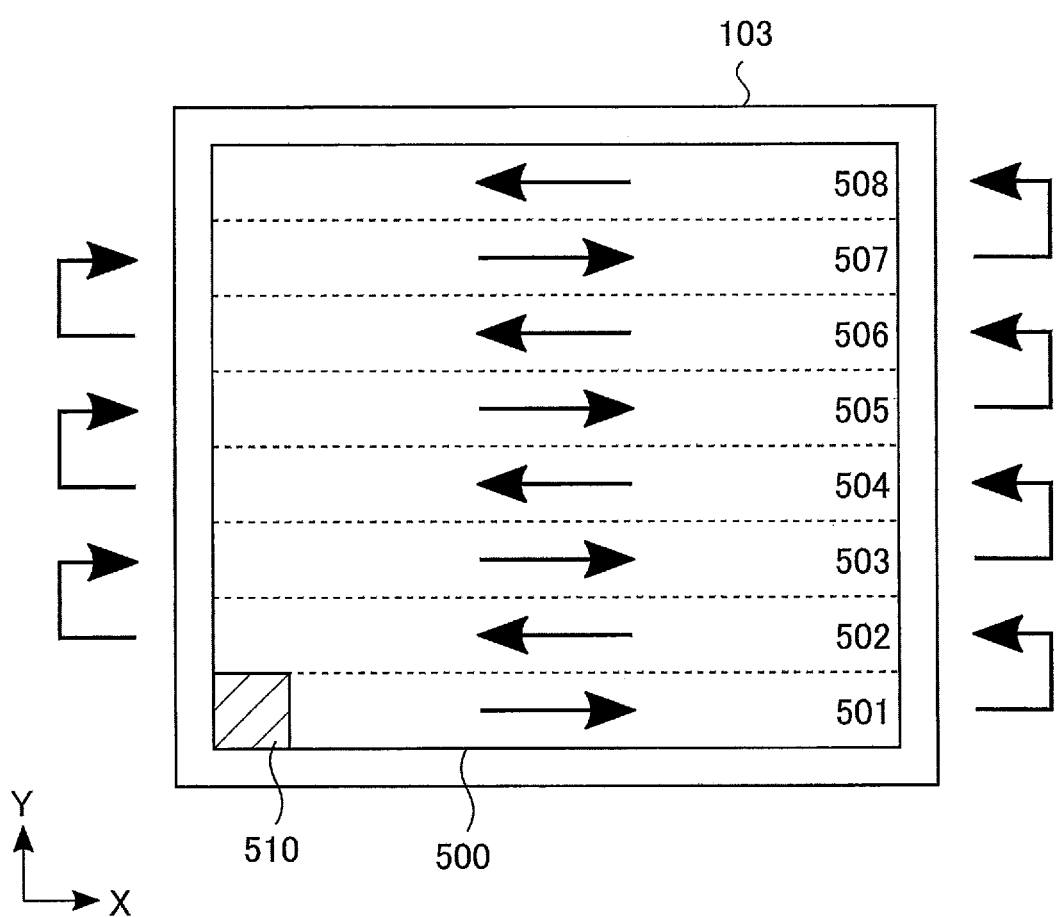
F I G. 3

| ID | Aperture coordinates | | | |
|---|---|---|---|---|
| | (1, 1) | (1, 2) | .... | (512, 512) |
| 00000 | OFF | ON | .... | OFF |
| 00001 | ON | ON | .... | ON |
| 00002 | ON | ON | .... | OFF |
| ⋮ | ⋮ | ⋮ | ⋮ | ⋮ |
| 99999 | ON | ON | .... | ON |
| 00000 | OFF | OFF | | OFF |
| ⋮ | ⋮ | ⋮ | ⋮ | ⋮ |

F I G. 4

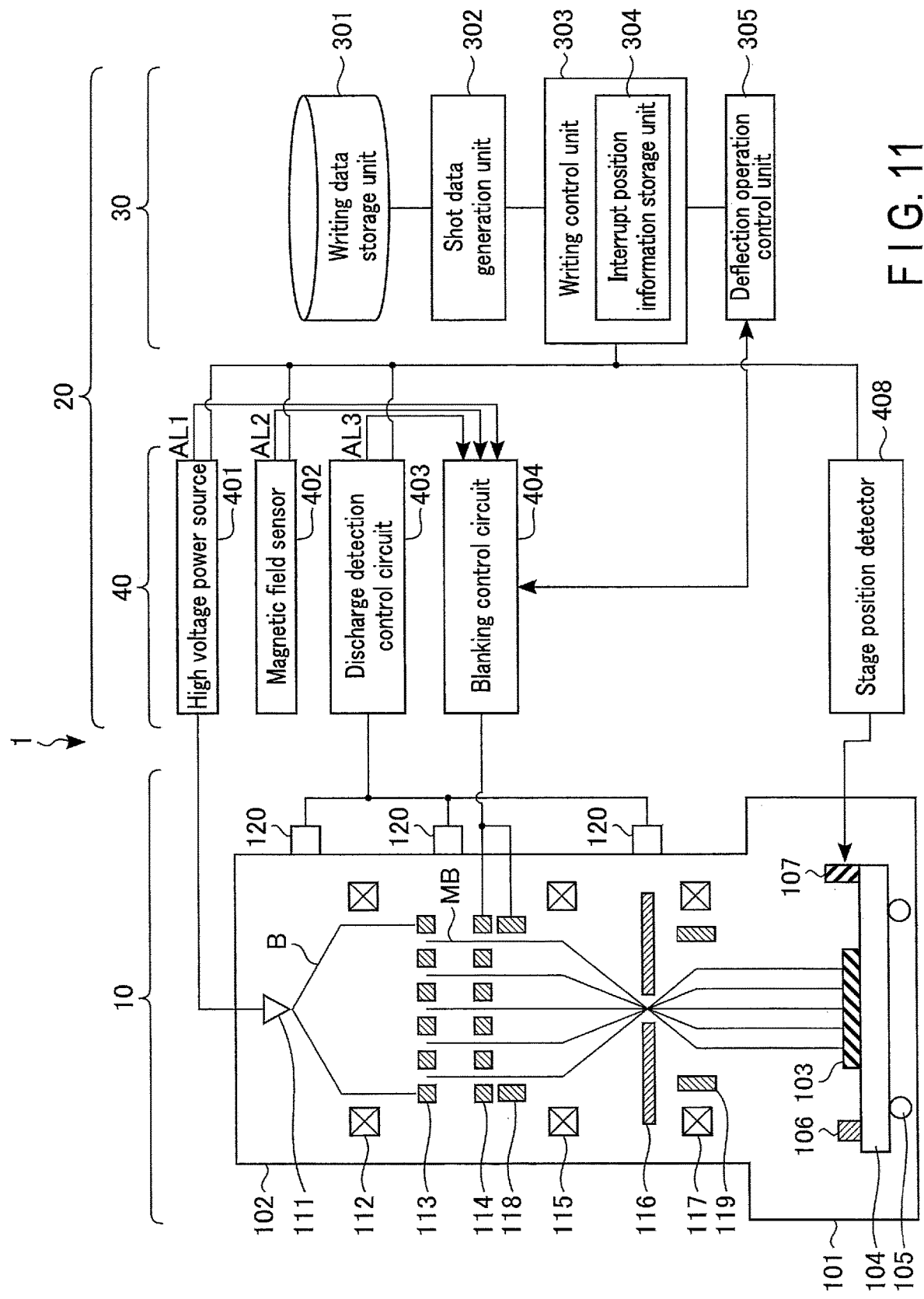
F I G. 11

CHARGED PARTICLE BEAM WRITING APPARATUS AND CHARGED PARTICLE BEAM WRITING METHOD

CROSS-REFERENCE TO RELATED APPLICATIONS

This application is based upon and claims the benefit of priority from Japanese Patent Application No. 2021-064193, filed Apr. 5, 2021, the entire contents of which are incorporated herein by reference.

FIELD

Embodiments described herein relate generally to a charged particle beam writing apparatus and a charged particle beam writing method.

BACKGROUND

In a process of manufacturing semiconductor devices, an original pattern (hereinafter also referred to as "a pattern") formed on a mask is exposed on a semiconductor substrate (also referred to as "a wafer") using a reduced projection exposure device (called "a stepper" or "a scanner"). For example, the mask is manufactured by a charged particle beam writing apparatus using a charged particle beam, such as electron beams.

For example, an electron beam writing apparatus, which is a type of charged particle beam writing apparatus, includes an electron gun as an emitting portion for emitting electron beams. A comparatively high voltage of several tens of kV or higher is applied across a cathode and an anode of the electron gun to accelerate thermal electrons emitted from the cathode. The accelerated thermal electrons are emitted from the electron gun.

The electron beams emitted from the electron gun are imaged on the mask via an electro-optical system including a plurality of apertures, deflectors, lenses, etc., thereby writing a desired pattern on the mask.

A type of electron beam writing apparatus is a multi-beam writing apparatus. A multi-beam writing apparatus exposes each pixel of a pattern to be written by using a plurality of electron beams. In a multi-beam writing apparatus using a blanking aperture array, multibeams are formed from, for example, an electron beam emitted from one electron gun passing through a blanking aperture array having a plurality of openings. Multibeams are blanking-controlled by a blanker (electrode pair) corresponding to each electron beam.

When the multi-beam writing apparatus described above writes a pattern on a mask, multi writing, in which the electron beams are irradiated a plurality of times on one pixel, may for example be used. Through the multi writing, an error in a positional accuracy of the pattern and an error in a connection accuracy of the pattern that occurs in a boundary of deflection areas of the electron beam are reduced by an effect of averaging.

In the electron beam writing apparatus, if an electromagnetic field variation occurs due to an earthquake or an abnormal electrical discharge during a writing operation, there is a possibility of an occurrence of a writing abnormality, which may cause a defect in pattern formation. Therefore, if an electromagnetic field variation occurs, it is necessary to stop writing promptly to suppress an occurrence of a mask scrap to a minimum.

Patent Literature 1 (Jpn. Pat. Appln. KOKAI Publication No. 2013-38397) discloses an electron beam writing apparatus and electron beam writing method, in which when earthquake information is received, writing is temporarily stopped after writing in a sub area has been completed, and thereafter writing is restarted when it is determined to be possible.

When the multiplicity of the multi writing in the multi-beam writing apparatus is increased, even if an abnormality in an electromagnetic field occurs once in the plurality of irradiations of electron beams, a mask scrap is not necessary if the effect on the pattern is small. Therefore, the number of shots to be executed in an electromagnetic field abnormal state can be suppressed by immediately interrupting the writing after the electromagnetic field abnormality is detected. Furthermore, the occurrence of mask scraps can be reduced by restarting the writing from the interrupted position.

Embodiments have been made in consideration of the above matters, and provide a charged particle beam writing apparatus and a charged particle beam writing method that can suppress occurrence of mask scraps.

SUMMARY

According to one embodiment of the invention, a charged particle beam writing apparatus includes: a writing mechanism configured to irradiate a plurality of charged particle beams to a target for writing a pattern, while performing blanking of each of the charged particle beams; a writing control circuit configured to control the writing mechanism based on shot data generated from the pattern; a deflection operation control circuit configured to generate control data for controlling the blanking of each of the charged particle beams based on the shot data transferred from the writing control circuit; a storage configured to store the shot data until writing based on the shot data is completed; a blanking control circuit configured to control the blanking based on the control data transferred from the deflection operation control circuit; and a detector configured to detect an abnormality. The writing control circuit is configured to, when the detector detects the abnormality during the writing, interrupt the writing, and generate interrupt position information at a position where the writing is interrupted based on the shot data which has been stored at the storage and is related to the control data that has not been used for controlling the blanking.

According to one embodiment of the invention, a charged particle beam writing method for writing a pattern by irradiating a plurality of charged particle beams, while performing blanking of each of the charged particle beams, the method includes: generating shot data based on the pattern; generating control data for blanking each of the charged particle beams based on the shot data; storing the shot data based on which the control data has been generated, until writing based on the shot data is completed; controlling the blanking based on the control data to perform writing; and when detecting an abnormality during the writing, interrupting the writing, and generating interrupt position information at a position where the writing is interrupted based on the shot data which has been stored and is related to the control data that has not been used for controlling the blanking.

BRIEF DESCRIPTION OF THE DRAWINGS

FIG. 2 is a plan view of a shaping aperture array substrate in the charged particle beam writing apparatus according to the first embodiment.

FIG. 3 is a conceptual view of a writing area of a sample to be a subject of writing in the charged particle beam writing apparatus according to the first embodiment.

FIG. 4 is a table showing a relationship between a shot ID and a shot condition in the charged particle beam writing apparatus according to the first embodiment.

FIG. 11 is a conceptual view of a charged particle beam writing apparatus according to a third embodiment.

DETAILED DESCRIPTION

Hereinafter, embodiments will be described with reference to the accompanying drawings. The embodiments exemplify a device and method for embodying the technical idea of the invention. The drawings are schematic or conceptual, and the dimensions and scales of the drawings are not necessarily the same as those of the actual products. The technical idea of the present invention is not specified by the shapes, configurations, arrangements, etc. of the structural components.

1. First Embodiment

A charged particle beam writing apparatus according to the first embodiment will be described. In the following, an electron beam writing apparatus that irradiates a multibeam is explained as an example of the charged particle beam writing apparatus of the first embodiment. The charged particle beam is not limited to an electron beam. The charged particle beam may be a single beam.

1.1 Configuration

Figure 1:
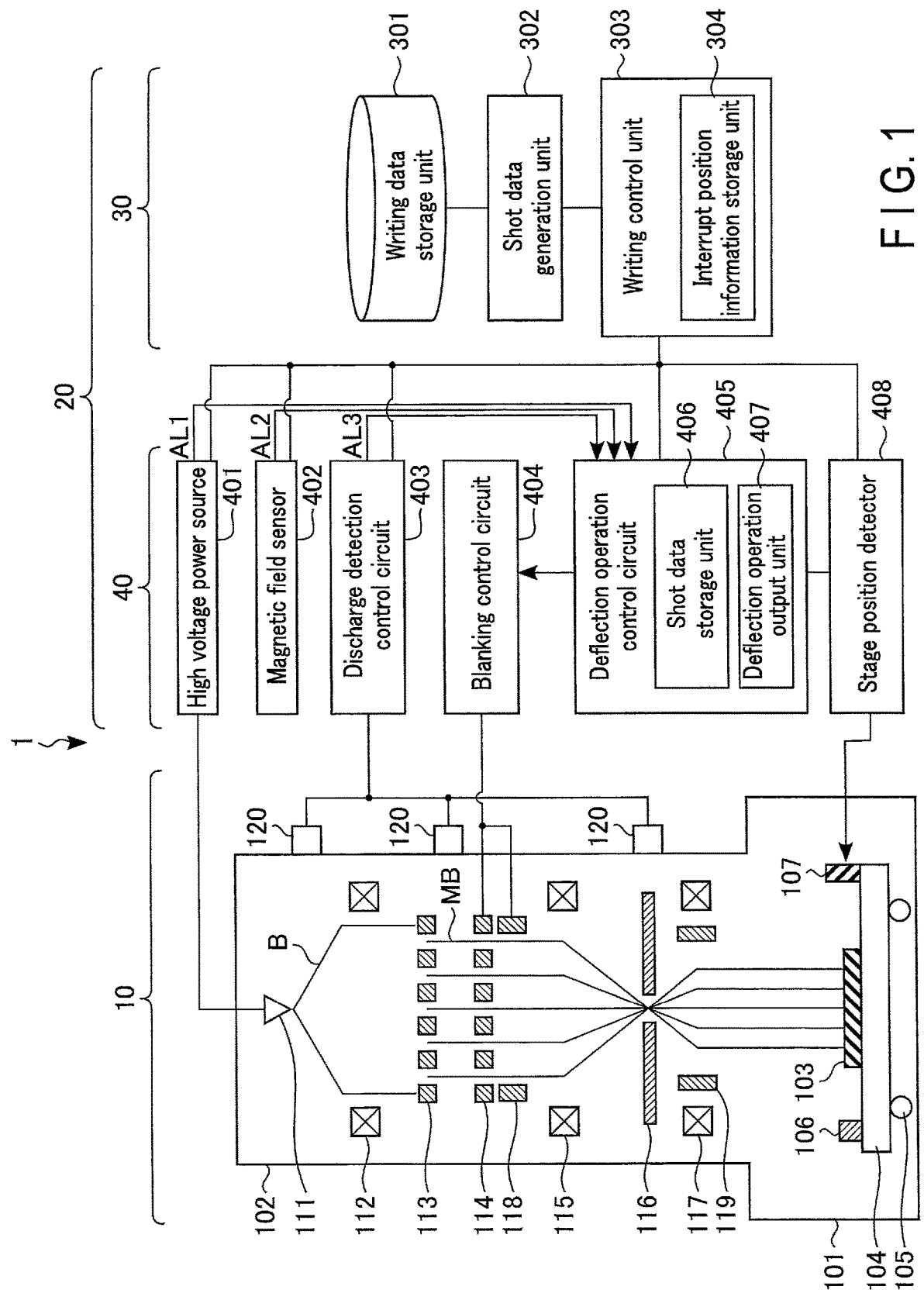
FIG. 1 is a conceptual view of a charged particle beam writing apparatus according to a first embodiment.

First, a configuration of an electron beam writing apparatus 1 will be explained with reference to FIG. 1. FIG. 1 is a conceptual view showing an example of a configuration of the electron beam writing apparatus 1. In FIG. 1, some of the couplings between the blocks are indicated; however, the couplings between the blocks are not limited to those shown in FIG. 1.

As shown in FIG. 1, the electron beam writing apparatus 1 includes a writing mechanism 10 and a control mechanism 20.

The writing mechanism 10 includes a writing chamber 101 and an optical column 102.

In the writing chamber 101, a stage 104 on which a sample 103 is to be mounted is provided. The sample 103 includes, for example, a mask (mask blank, reticle, etc.) and a semiconductor substrate. The stage 104 is movable in an X direction parallel to the surface of the stage 104 (the sample 103) and a Y direction parallel to the surface of the stage 104 and intersecting the X direction.

A stage drive mechanism 105 includes a drive mechanism to move the stage 104 on an XY plane defined by the X direction and the Y direction. The stage drive mechanism 105 may include a mechanism having a rotation axis in a Z direction perpendicular to the surface of the stage 104 (XY plane) and be configured to rotate the stage 104 on the XY plane around the rotation axis, and may also include a mechanism configured to move the stage 104 in the Z direction.

A stage position detector 408 includes a laser length measurement system. The laser length measurement system irradiates a laser to a mirror 107 disposed on the stage 104, and receives the laser reflected by the mirror 107. The laser length measurement system measures a position of the stage 104 in the X direction and the Y direction based on the information of the received laser.

A Faraday cup 106 is disposed on the stage 104, and is used for monitoring an electron beam or retracting a beam which is described later.

The mirror 107 is disposed on the stage 104 and is used to detect a position of the stage 104.

The optical column 102 is disposed on the writing chamber 101. The optical column 102 has, for example, a columnar shape that extends in the Z direction. The writing chamber 101 and the optical column 102 are open at their respective surfaces that are in contact with each other. The space formed by the writing chamber 101 and the optical column 102 is maintained in a vacuum (low pressure) state. The optical column 102 is formed of, for example, a conductive material, such as stainless steel, and is grounded at a ground potential.

The optical column 102 includes an electron gun (charged particle gun) 111, an illumination lens 112, a shaping aperture array substrate 113, a blanking aperture array mechanism 114, a reducing lens 115, a limiting aperture substrate 116, an objective lens 117, a batch blanker 118, and a deflector 119. the illumination lens 112, the shaping aperture array substrate 113, the blanking aperture array mechanism 114, the reducing lens 115, the limiting aperture substrate 116, the objective lens 117, the batch blanker 118, and the deflector 119 constitute an electro-optical system. The configuration of the electro-optical system is not limited to the configuration described above.

The electron gun 111 is disposed to emit an electron beam B toward the writing chamber 101.

The illumination lens 112 directs the trajectory of the electron beam B emitted from the electron gun 111 substantially perpendicular to the shaping aperture array substrate 113 (in the Z direction), so that the shaping aperture array substrate 113 is entirely illuminated with the electron beam B. For example, an electromagnetic lens may be used as the illumination lens 112.

The shaping aperture array substrate 113 has a plurality of openings. The electron beam B that has passed through the openings is shaped as multibeams MB.

FIG. 2 shows an example of a plan view of the shaping aperture array substrate 113. As shown in FIG. 2, a plurality of openings 130 arranged in a matrix in the X direction and the Y direction are provided in the shaping aperture array substrate 113. In the example shown in FIG. 2, coordinates of each opening 130 (hereinafter referred to as "aperture coordinates") are indicated as (x,y)=(1,1) to (512, 512) from the lower left portion to the upper right portion of the plane of the drawing. The number of the openings 130 may be determined arbitrarily. The shape of the openings 130 is not limited. For example, the shape of the openings 130 may be rectangular or circular. The arrangement of the openings 130 may be designed arbitrarily. For example, the openings 130 may be arranged in a staggered pattern.

The blanking aperture array mechanism 114 includes a mechanism configured to independently blanking-control the electron beams (multibeams MB) passed through the respective openings 130 of the shaping aperture array substrate 113. The blanking aperture array mechanism 114 includes a plurality of blankers (electrode pairs) corresponding to each of the openings 130 of the shaping aperture array substrate 113. For example, one of the electrodes of a blanker is fixed to the ground potential. The other of the electrodes of the blanker is switched between the ground potential and another potential. Due to the switching between the potentials, the electron beam passing through the blanker is deflection-controlled. The electron beam deflection-controlled by the blanking aperture array mechanism 114 is blocked by a limiting aperture substrate 116 which is described later, and does not reach the sample 103 (OFF state). On the other hand, the electron beam that is not deflection-controlled by the blanking aperture array mechanism 114 reaches the sample 103 (ON state).

The reducing lens 115 reduces the multibeams MB toward an opening provided at a center of the limiting aperture substrate 116. For example, an electromagnetic lens may be used as the reducing lens 115.

The batch blanker 118 deflects the beams passed through the blanking aperture array mechanism 114 in batches.

The limiting aperture substrate 116 blocks the multibeams MB deflected in batches by the batch blanker 118, and the electron beam deflected by blanking control of the blanking aperture array mechanism 114 among the multibeams MB.

The objective lens 117 adjusts a focus of the multibeams MB passed through the limiting aperture substrate 116. The focus-adjusted multibeams MB form a pattern image of a preset reduction ratio on the sample 103. For example, an electromagnetic lens may be used as the objective lens 117.

The deflector 119 deflects the multibeams MB so as to be irradiated to a desired position of the stage 104 (sample 103), and writes a pattern on the sample 103 by the multibeams MB.

FIG. 3 shows a conceptual view of an example of the order of writing on the surface of the sample 103. As shown in FIG. 3, a writing area 500 of the sample 103 is imaginarily divided into a plurality of stripe areas 501 to 508 having a preset width, for example, in the Y direction. In the example shown in FIG. 3, the writing area is divided into the eight stripe areas 501 to 508; however, the number of stripe areas may be set to any number. The stage drive mechanism 105 moves the stage 104 so that the writing can be continuously performed on the divided eight stripe areas 501 to 508. More specifically, for example, the stage drive mechanism 105 first causes a irradiation area 510 that can be irradiated with one shot to move in the stripe area 501 in the X direction from the left to the right on the plane of the drawing. In other words, the stage drive mechanism 105 moves the stage 104 in the X direction from the right to the left on the plane of the drawing. After the writing in the stripe area 501 is completed, the stage drive mechanism 105 causes the irradiation area 510 to move in the stripe area 502 in the direction opposite to that of the movement in the stripe area 501. Next, in the stripe area 503, the stage drive mechanism 105 causes the irradiation area 510 to move in the direction opposite to that of the movement in the stripe area 502. In the other stripe areas 504 to 508, the writing is performed in the same manner while the direction of the movement of the irradiation area 510 is changed in the opposite directions alternately. For example, when the writing is interrupted before the writing in the stripe area 503 is completed, the writing is stopped in the stripe area 503.

A plurality of discharge detectors 120 as detectors are mounted on the optical column 102. The discharge detectors 120 detect an abnormal discharge that occurs in the electron gun 111 and the electro-optical system. For example, the discharge detectors 120 include an antenna electrode provided inside the optical column 102. The discharge detectors 120 detect, for example, a current that is generated due to a charge in the antenna electrode.

The detectors are not limited to the discharge detectors. A magnetic field sensor 402 (described later) configured to detect a magnetic field variation, such as an earthquake, or any other detector configured to detect an abnormality that requires an interruption is applicable as the detectors. The location where the detectors are mounted is not limited to the optical column 102; the detectors may be provided outside the apparatus.

The control mechanism 20 includes a software portion 30 controlled by software (a program, firmware, or the like executed by a computer composed of circuits) and a hardware portion 40 controlled by hardware (namely, dedicated circuits). Functions of the software are implemented, for example, through execution of the firmware by a processor (CPU) provided in the computer.

A writing data storage unit 301 stores writing data (layout data) input from outside. For example, a storage medium, such as a hard disk drive (HDD) or a solid state drive (SSD), may be used as the writing data storage unit 301.

A shot data generation unit 302 generates shot data corresponding to each shot and control data for the batch blanker 118 based on the writing data stored in the writing data storage unit 301. The shot data generation unit 302 may be provided outside the apparatus.

The shot data includes information of, for example, irradiation conditions in each shot of the multibeams MB (ON/OFF of the electron beam in each blanker and irradiation time of the electron beam), a writing position, etc., as control data for the blanking aperture array mechanism 114. The shot data generation unit 302 also assigns a shot ID to shot data, so that each shot can be identified.

FIG. 4 shows an example of a table indicating the shot data. The example of FIG. 4 represents a case in which shot IDs of preset arbitrary numbers (for example, 00000 to 99999) are repeatedly assigned to the shots in accordance with the order of shots (hereinafter referred to as a "cyclic" system). The number of cyclic shot IDs may be set, for example, in accordance with the number of shots that can be retained in a shot data storage unit 406. Using the cyclic shot IDs, it is possible to suppress the increase in the amount of data (the number of digits) of the shot ID corresponding to one shot. The number of cyclic shot IDs may be determined in units of stripe areas, or in units of areas narrower than the stripe areas. Furthermore, a different shot ID may be assigned to every shot. Note that it is not necessary for all shots to be assigned a shot ID. For example, it suffices that the writing position of unprocessed data (control data for which writing has not been completed and has not been used for blanking control) in the hardware portion 40 is specified.

As shown in FIG. 4, each row of the table corresponds to information of one shot. The indication "ON" or "OFF" at each point in the aperture coordinates indicates ON/OFF control of the corresponding electron beam. Information of irradiation time is further given to the shot data, so that the irradiation time of the beam in the ON state is defined. Alternatively, the table may indicate only information of irradiation time by defining the irradiation time 0=OFF and the irradiation time greater than 0=ON.

A writing control unit 303 controls the electron beam writing apparatus 1. The writing control unit 303 includes an interrupt position information storage unit 304.

The writing control unit 303 retains the generated shot data. The writing control unit 303 acquires position data of the stage 104 from the stage position detector 408 and controls the stage drive mechanism 105.

The interrupt position information storage unit 304 stores interrupt position information. For example, a random access memory (RAM) may be used as the interrupt position information storage unit 304. The interrupt position information storage unit 304 may be provided outside the writing control unit 303.

The writing control unit 303 may include a display unit to display a result of abnormality detection, or an output unit to output interrupt position coordinates maintained as a log.

The writing control unit 303 controls a high voltage power source 401, the magnetic field sensor 402, a discharge detection control circuit 403, a blanking control circuit 404, a deflection operation control circuit 405, and the stage position detector 408 included in the hardware portion 40.

The high voltage power source 401 applies to the electron gun ill a high voltage that allows the electron gun 111 to emit the electron beam B. When the voltage applied to the electron gun 111 deviates from a preset standard due to, for example, an abnormal discharge, the high voltage power source 401 transmits an alarm signal AL1 that notifies the deflection operation control circuit 405 of a detection of the abnormality.

The magnetic field sensor 402 detects a magnetic field variation that occurs due to an earthquake or a current flowing through the circuits in the electron beam writing apparatus 1. Then, for example, when the result of measurement of the magnetic field is outside a preset range, the magnetic field sensor 402 transmits an alarm signal AL2 that notifies the deflection operation control circuit 405 of a detection of the abnormality.

The discharge detection control circuit 403 transmits an alarm signal AL3 that notifies the deflection operation control circuit 405 that the discharge detector 120 has detected an abnormal discharge.

The blanking control circuit 404 controls the blanking aperture array mechanism 114 and the batch blanker 118. The blanking control circuit 404 receives control data from the deflection operation control circuit 405. The blanking control circuit 404 includes, for example, a shift register or the like, and may retain control data for a plurality of shots. The blanking control circuit 404 performs ON/OFF control of each electron beam in the multibeams MB. In other words, the blanking control circuit 404 controls a voltage applied to each blanker in the blanking aperture array mechanism 114. The blanking control circuit 404 controls ON/OFF of the electron beam and the irradiation time of the electron beam at each blanker.

The deflection operation control circuit 405 includes the shot data storage unit 406 and a deflection operation output unit 407. The shot data storage unit 406 stores shot data transferred from the writing control unit 303.

The deflection operation control circuit 405 is a deflection operation control unit configured to calculate deflection amount data of the multibeams MB by causing the multibeams MB to deflect to follow the movement of the stage 104 based on the position data and to be irradiated to a desired position. The deflection operation control circuit 405 controls, for example, the deflector 119 based on the deflection amount data. The deflection operation control circuit 405 transfers the control data to the blanking control circuit 404 so that the blanking control can be followed by the movement of the stage 104.

1.2 Operations of Electron Beam Writing Apparatus

Next, operations of the electron beam writing apparatus 1 according to the present embodiment will be explained. In this embodiment, one of three operation modes of the electron beam writing apparatus 1 is selected in advance based on a writing level of each sample on which writing is to be performed. When an abnormality is detected during the writing, the electron beam writing apparatus 1 interrupts the writing and executes the selected operation mode. As the operation mode, one of the three modes of, for example, a standby mode, a diagnosis mode, and a stop mode is selected.

The standby mode is a mode in which the electron beam writing apparatus 1 is set to a standby state after the writing is interrupted until the abnormality is settled, and the writing is restarted after the abnormality is settled. In the standby mode, for example, the electron beam writing apparatus 1 is set in the standby state for a preset period. For example, if the abnormality is not settled within the period, resulting in a timeout, the writing is stopped.

The diagnosis mode is a mode in which a malfunction diagnosis is executed, and if the electron beam writing apparatus is diagnosed as normal, the writing is restarted. In the diagnosis mode, for example, if a malfunction is found as a result of the malfunction diagnosis, the writing is stopped.

The stop mode is a mode in which the writing is stopped if an abnormality is detected during the writing.

1.2.1 Flow of Operations

Figure 5:
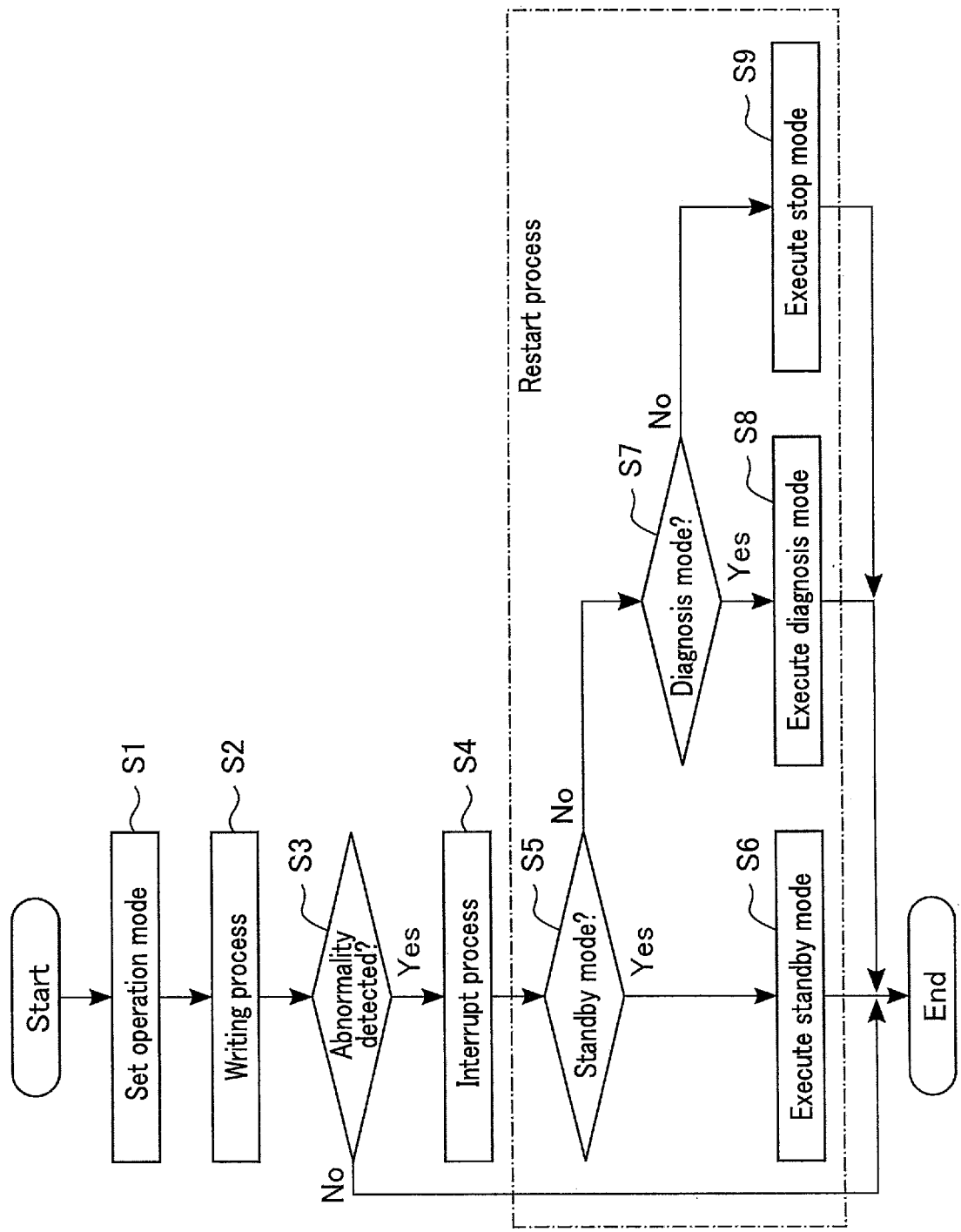
FIG. 5 is a flowchart showing a flow of writing operations in the charged particle beam writing apparatus according to the first embodiment.

First, a flow of the operations will be explained with reference to a flowchart of FIG. 5 showing an example of the writing operations.

As shown in FIG. 5, first, an operation mode after detection of an abnormality, such as an abnormal discharge, is set (step S1).

After the operation mode is set, the writing control unit 303 executes writing (step S2). Specifically, the multibeams MB are irradiated to the sample 103 to write a pattern.

If no abnormality is detected during the writing (step S3_No), the writing is ended after a desired pattern is written on the sample 103.

If an abnormality is detected during the writing (step S3_Yes), the writing is interrupted (step S4). Then, in accordance with the set operation modes, the writing is restarted or stopped (step S5 to S9).

1.2.2 Operation when Standby Mode is Set

Figure 6:
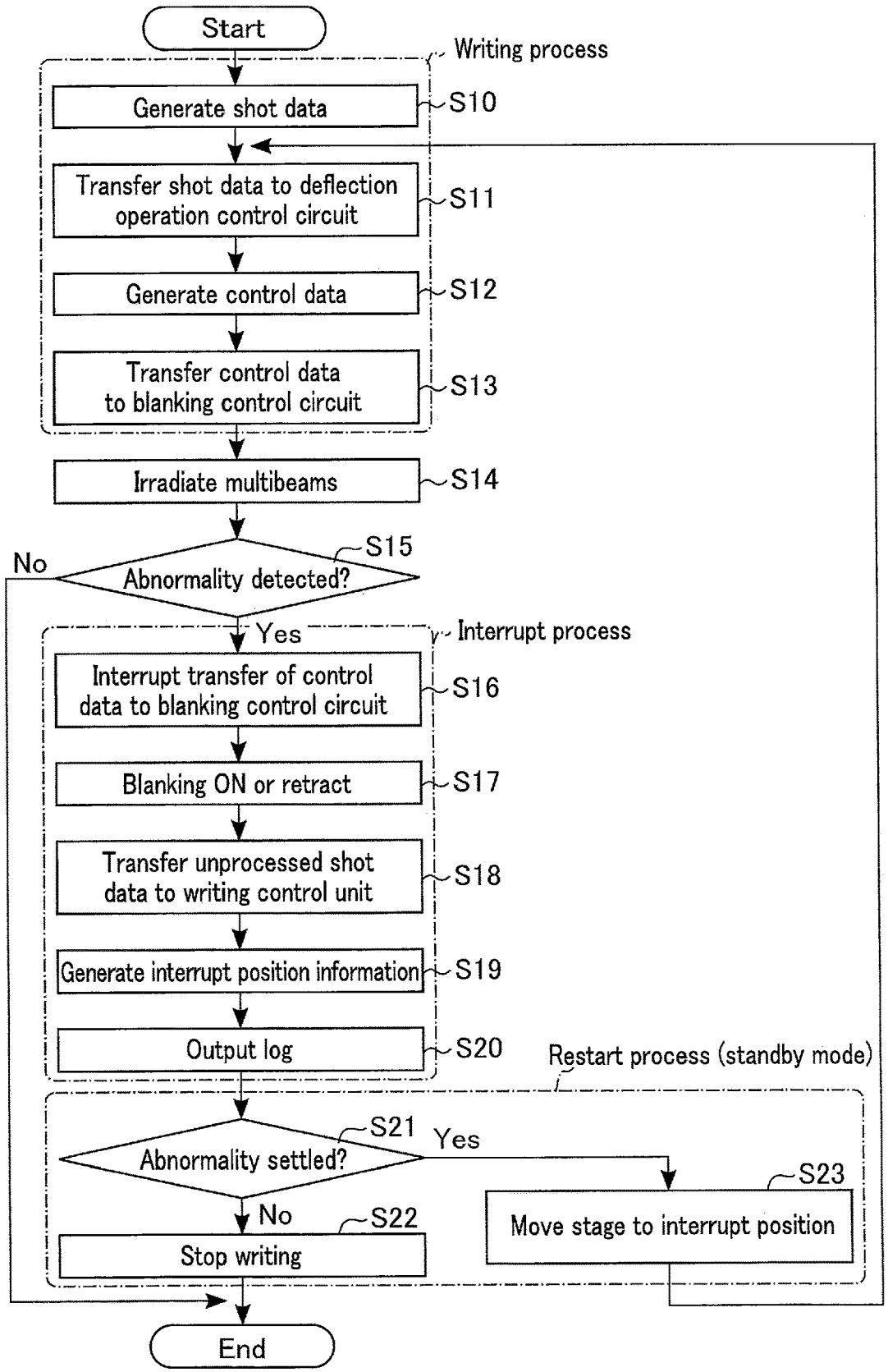
FIG. 6 is a flowchart showing a flow of writing operations in a case in which a standby mode is set in the charged particle beam writing apparatus according to the first embodiment.

Next, the writing operations when the standby mode is set will be explained with reference to FIG. 6. FIG. 6 is a flowchart showing an example of the writing operations when the standby mode is set. In the following, operations relating to transmission and reception of shot data will be mainly explained. FIG. 6 shows operations after the operation mode is set as illustrated in FIG. 5.

As shown in FIG. 6, first, in a writing process, the shot data generation unit 302 generates shot data based on writing data transferred from the writing data storage unit 301 (step S10). At this time, the shot data is assigned a shot ID tied to the writing position. The shot data generation unit 302 transmits the shot data to the writing control unit 303.

The writing control unit 303 transfers the shot data to the deflection operation control circuit 405 (step S11). The deflection operation control circuit 405 stores the transferred shot data in the shot data storage unit 406. The stored shot data is stored until the data processing, namely, the writing, is completed.

Next, the deflection operation control circuit 405 generates control data to sequentially turn on and off the blanking operations in accordance with the progress of the writing based on the shot data stored in the shot data storage unit 406 (step S12). The deflection operation control circuit 405 then transfers the control data to the blanking control circuit 404 (step S13). The control data does not include information that can specify a writing position.

The blanking control circuit 404 controls the blanking aperture array mechanism 114 based on the control data. The multibeams MB blanking-controlled in the blanking aperture array mechanism 114 are irradiated to the sample 103 (step S14).

If no abnormality is detected in the writing process (step S15_No), the writing is ended after a desired pattern is written on the sample 103.

If an abnormality is detected in the writing (step S15_Yes), the deflection operation control circuit 405 receives at least one of the alarm signals AL1 to AL3 giving notification of an occurrence of the abnormality.

Upon receipt of at least one of the alarm signals AL1 to AL3, the deflection operation output unit 407 of the deflection operation control circuit 405 interrupts the transfer of the control data to the blanking control circuit 404 (step S16). The blanking control circuit 404 forces turning-on of the blanking to deflect the multibeams MB in batches to a beam-off state, or controls the stage drive mechanism 105 to move the stage 104 so as to retract the sample 103 (step S17). At this time, the stage drive mechanism 105 may move the stage 104 so that the multibeams MB are irradiated to the Faraday cup 106.

The deflection operation control circuit 405 transfers unprocessed shot data to the writing control unit 303 (step S18). More specifically, for example, the deflection operation control circuit 405 transfers to the writing control unit 303 the shot ID of shot data for generating control data that will be transferred next unless the writing is interrupted, out of all shot data for generating control data that have not been transferred to the blanking control circuit 404. The deflection operation control circuit 405 may transmit information on the abnormality detection to the writing control unit 303. In this case, the writing control unit 303 may display a result of the detection.

The writing control unit 303 generates interrupt position information of writing (writing position) from the shot ID of the transferred unprocessed shot data (step S19). The writing control unit 303 stores the generated interrupt position information in the interrupt position information storage unit 304.

After interrupting the writing process, the writing control unit 303 outputs the writing position where the writing is interrupted as a log (step S20). If the writing control unit 303 includes the display unit, the log may be displayed on the display unit.

It is determined whether the abnormal discharge is settled by non-reception of the alarm signals AL1 to AL3 within a preset time (standby time) (step S21).

For example, if the abnormal state continues and the abnormality is not settled within the preset time (step S21_No), the writing control unit 303 stops the writing (step S22). The writing control unit 303 may, for example, output information relating to the stopping of the writing to the outside.

If the abnormality is settled within the preset time (step S21_Yes) or no abnormality is detected, the deflection operation control circuit 405 transmits information giving notification of the settlement of the abnormality to the writing control unit 303. At this time, new shot data is generated if necessary. Based on the interrupt position information, the writing control unit 303 controls the stage drive mechanism 105, and moves the stage 104 to the interrupt position (step S23). The writing control unit 303 returns to step S11 and restarts the transfer of the shot data to the deflection operation control circuit 405, thereby restarting the writing.

1.2.3 Writing Operations when Diagnosis Mode is Set

Figure 7:
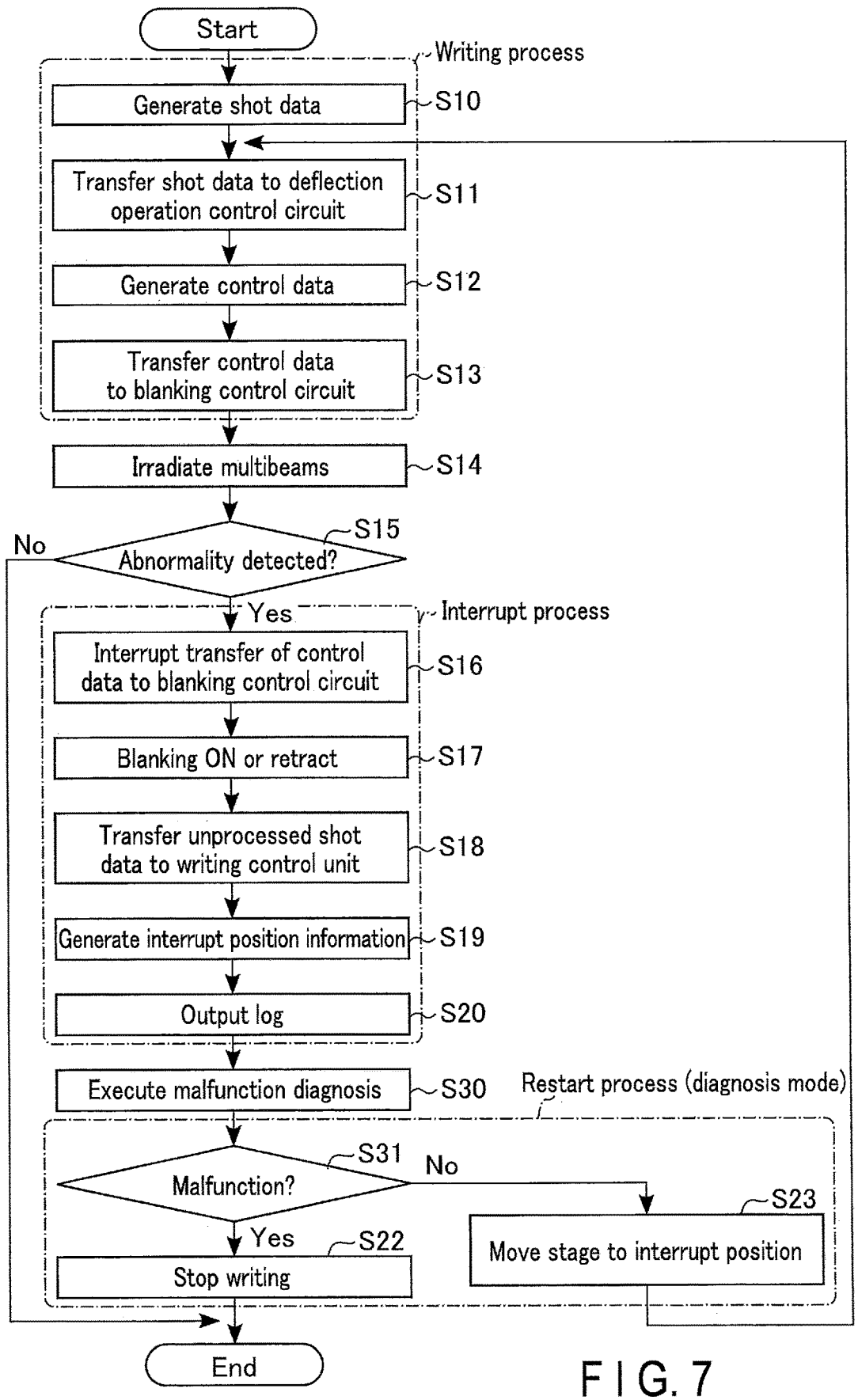
FIG. 7 is a flowchart showing a flow of writing operations in a case in which a diagnosis mode is set in the charged particle beam writing apparatus according to the first embodiment.

Next, writing operations when the diagnosis mode is set will be explained with reference to FIG. 7. FIG. 7 is a flowchart showing an example of the writing operations when the diagnosis mode is set. The following descriptions will focus mainly on matters different from those shown in FIG. 6.

As shown in FIG. 7, the writing process and the interrupt process (steps S10 to S20) are similar to those in FIG. 6.

When the abnormality is settled, the writing control unit 303 executes a malfunction diagnosis (step S30).

An appropriate method of the malfunction diagnosis is selected as needed. For example, the hardware portion 40 may include a self-diagnosis circuit (not shown) to perform a malfunction diagnosis for the electron beam writing apparatus 1. The self-diagnosis circuit, after the abnormality is settled, for example, temporarily erases the data remaining in the hardware portion 40 to reset the hardware, and performs a malfunction diagnosis. The writing control unit 303 determines whether the writing can be restarted based on the result of the malfunction diagnosis by the self-diagnosis circuit.

Alternatively, the writing control unit 303 may perform writing with a use of test data, and may perform a malfunction diagnosis based on the result of the writing with the use of the test data. For example, the writing control unit 303 includes a malfunction determination unit (not shown). More specifically, for example, the writing control unit 303 controls the stage drive mechanism 105 to move the stage 104, so that the Faraday cup 106 on the stage 104 is located at a writing position. Then, the writing control unit 303 performs the writing with the use of the test data, and compares an output of digital data with data output at a normal time using the malfunction determination unit, thereby executing the malfunction diagnosis. Alternatively, the writing control unit 303 may execute the malfunction diagnosis by diagnosing an output of digital data through the malfunction determination unit based on a checksum.

Furthermore, for example, an apparatus diagnosis based on a voltage measurement may be performed as a malfunction diagnosis. More specifically, an analog output voltage of the circuit which produces an analog output, such as various power supplies (for example, power supplies for the lens, the deflector, and the like) and a digital-to-analog converter (DAC) amplifier disposed in the electron beam writing apparatus 1, is measured, and a measurement value and a setting value are compared.

Alternatively, for example, whether the multibeams MB are normally irradiated may be diagnosed as a malfunction diagnosis. More specifically, for example, the writing control unit 303 scans a positioning mark provided on the surface of the sample 103 with the multibeams MB. At this time, the writing control unit 303 may check a deviation of the focus and the writing position of the multibeams MB, and check whether the multibeams MB include a defective beam, namely, an electron beam that is not irradiated normally. In other words, the writing control unit 303 checks whether a writing precision required for the sample 103 is ensured.

The malfunction diagnosis may include two or more malfunction diagnoses.

As a result of the malfunction diagnosis, if the writing control unit 303 determines that there is a malfunction (step S31_Yes), the writing control unit 303 stops the writing (step S22). The writing control unit 303 may, for example, output information relating to the stopping of the writing.

If the writing control unit 303 determines that there is no malfunction (step S31_No), the writing control unit 303 controls the stage drive mechanism 105 and moves the stage 104 to the interrupt position based on the interrupt position information (step S23). The writing control unit 303 returns to step S11 and restarts transfer of the shot data to the deflection operation control circuit 405, thereby restarting the writing.

1.2.4 Writing Operations when Stop Mode is Set

Figure 8:
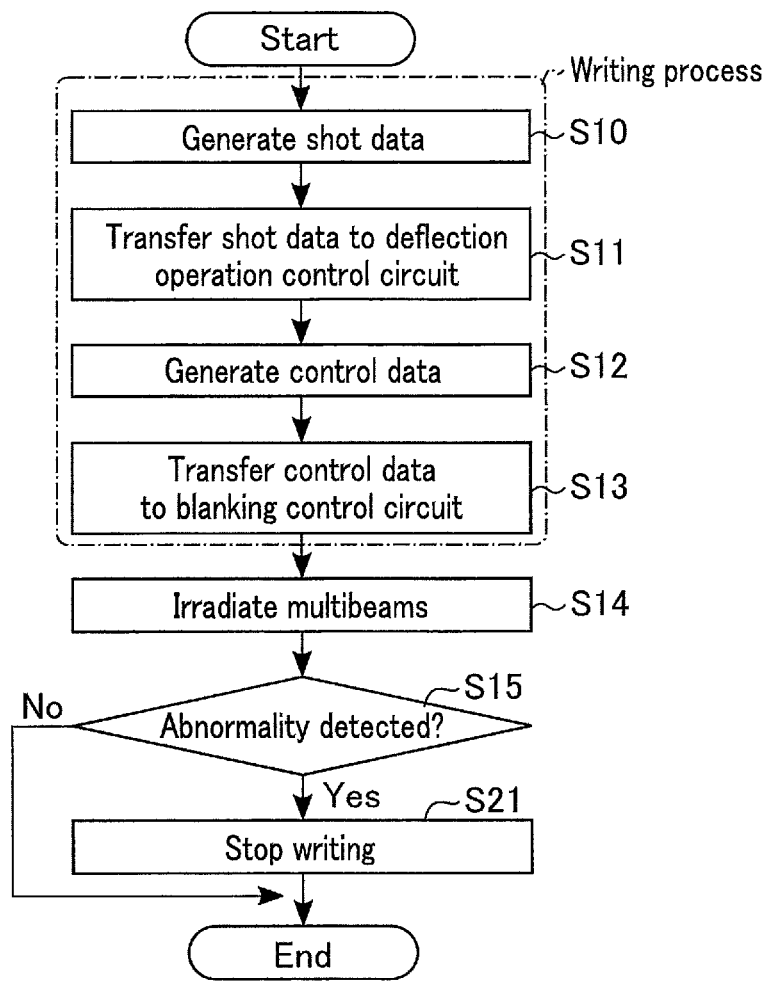
FIG. 8 is a flowchart showing a flow of writing operations in a case in which a stop mode is set in the charged particle beam writing apparatus according to the first embodiment.

Next, writing operations when the stop mode is set will be explained with reference to FIG. 8. FIG. 8 is a flowchart showing an example of the writing operations when the stop mode is set. The following descriptions will focus mainly on matters different from those shown in FIG. 6.

As shown in FIG. 8, the writing process (steps S10 to S13) is similar to that in FIG. 6.

When the stop mode is selected, if an abnormality is detected, the writing control unit 303 stops the writing (step S21). At this time, if necessary, the writing control unit 303 outputs a log.

1.3 Advantageous Effects of Present Embodiment

According to the present embodiment, after detecting an abnormality, the data transfer from the deflection operation control circuit is interrupted to immediately interrupt the writing, so that the number of shots executed in the abnormal state can be suppressed. Then, the writing is restarted from the interrupt position based on the interrupt position information generated from the unprocessed shot data by the deflection operation control circuit, so that the occurrence of the mask scrap can be reduced.

2. Second Embodiment

Next, a second embodiment will be described. The second embodiment relates to an electron beam writing apparatus 1 having a configuration different from that of the first embodiment. The following descriptions will focus mainly on matters different from those of the first embodiment.

2.1 Configuration of Electron Beam Writing Apparatus

Figure 9:
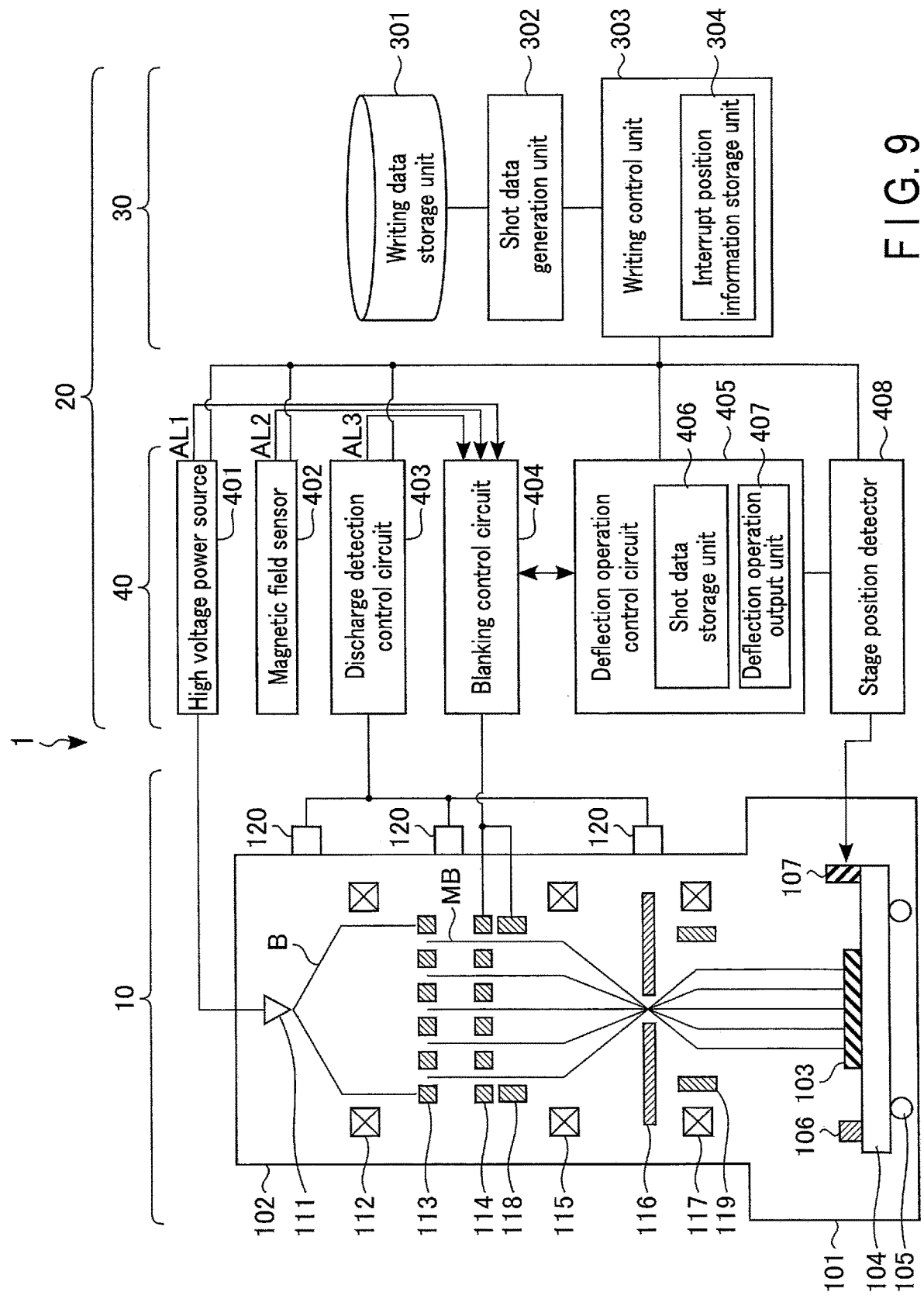
FIG. 9 is a conceptual view of a charged particle beam writing apparatus according to a second embodiment.

First, a configuration of the electron beam writing apparatus 1 will be described with reference to FIG. 9. FIG. 9 is a conceptual diagram showing an example of the configuration of the electron beam writing apparatus 1. In FIG. 9, some of the couplings between the blocks are indicated; however, the couplings between the blocks are not limited to those shown in FIG. 9.

As shown in FIG. 9, the configurations of the writing mechanism 10 and the software portion 30 are similar to those of the first embodiment.

In the present embodiment, a high voltage power source 401, a magnetic field sensor 402, and a discharge detection control circuit 403 respectively transmit alarm signals AL1, AL2, and AL3 to a blanking control circuit 404.

The other configurations of the hardware portion 40 are similar to those of the first embodiment.

2.2 Writing Operations

Next, writing operations will be described. The flow of the writing operations is the same as that of the first embodiment.

Figure 10:
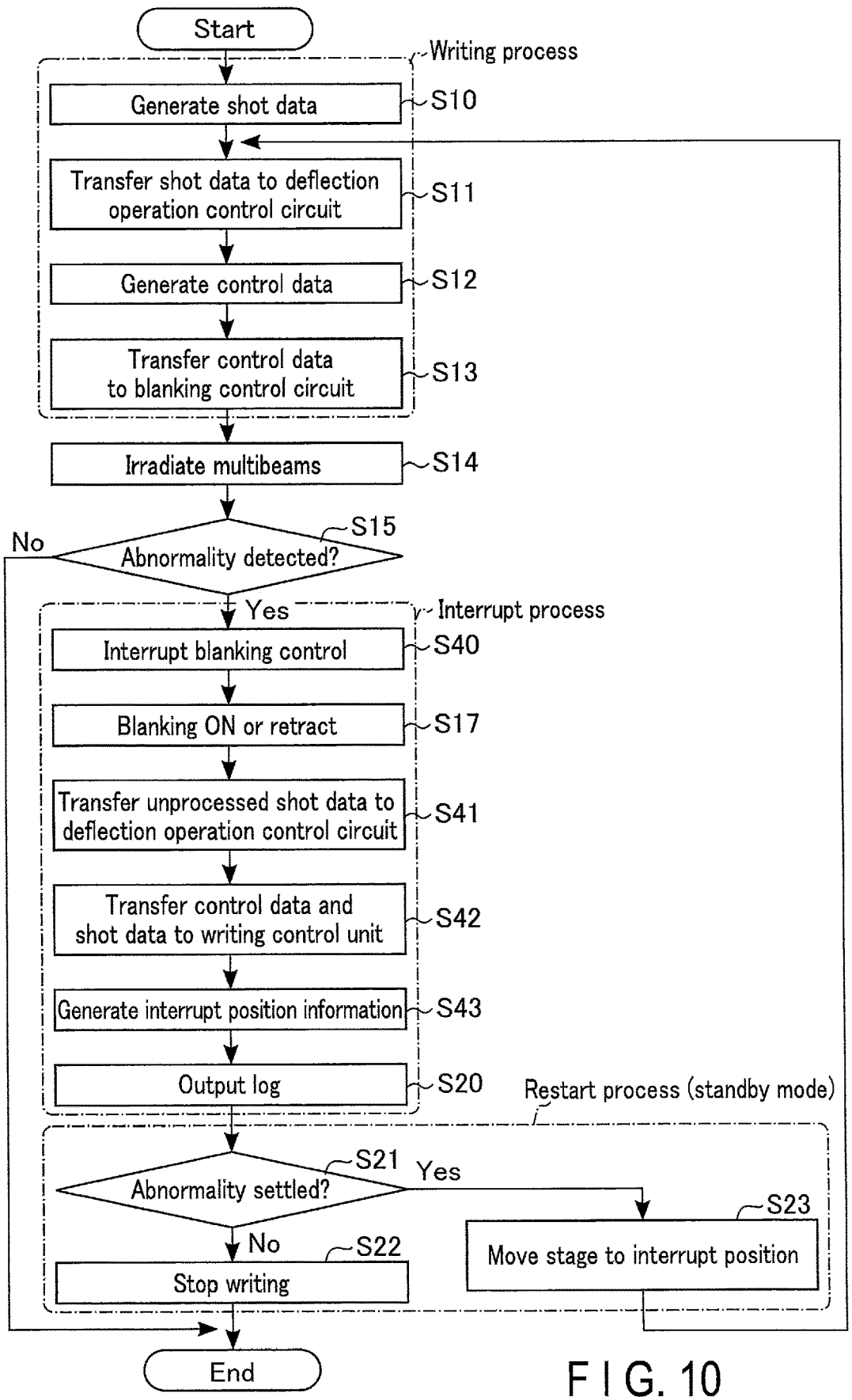
FIG. 10 is a flowchart showing a flow of writing operations in a case in which a standby mode is set in the charged particle beam writing apparatus according to the second embodiment.

In the following, writing operations when the standby mode is set will be explained with reference to FIG. 10. FIG. 10 is a flowchart showing an example of the writing operations when the standby mode is set.

As shown in FIG. 10, operations in steps S10 to S15 of the writing process are similar to those in the first embodiment shown in FIG. 6.

Upon detection of an abnormality (step S15_Yes), the blanking control circuit 404 that receives at least one of alarm signals AL1 to AL3 interrupts the blanking control (step S40), and turns off the multibeams MB or retracts the sample 103 in the same manner as in the first embodiment (step S17). Then, the blanking control circuit 404 transfers, to the deflection operation control circuit 405, unprocessed control data contained therein which has not been used for the blanking control (step S41). The blanking control circuit 404 may transmit information on the abnormality detection to the deflection operation control circuit 405.

The deflection operation control circuit 405 transfers, to the writing control unit 303, unprocessed control data transferred from the blanking control circuit 404, and the shot ID of shot data for generating control data that will be transferred next to the blanking control circuit 404 unless the writing is interrupted, out of all shot data for generating control data that have not been transmitted to the blanking control circuit 404 (step S42). The writing control unit 303 generates interrupt position information based on the number of shot counts generated based on the transferred unprocessed control data and the shot ID of the shot data (step S43).

The operations in step S20 to step S23 are similar to those in the first embodiment described with reference to FIG. 6.

2.3 Advantageous Effects of Present Embodiment

According to the present embodiment, the same effects as those of the first embodiment can be obtained. In addition, since data transfer from the blanking control circuit 404 provided downstream of the deflection operation control circuit 405 can be interrupted, and the number of shots executed in the abnormal state can be suppressed, the occurrence of the mask scrap can be further reduced.

3. Third Embodiment

Next, the third embodiment will be described. The third embodiment relates to an electron beam writing apparatus 1 having a configuration different from that of the first and second embodiments. Hereinafter, the explanation will focus mainly on matters which differ from the first and second embodiments.

3.1 Configuration of Electron Beam Writing Apparatus

First, a configuration of an electron beam writing apparatus 1 will be described with reference to FIG. 11. FIG. 11 is a conceptual diagram illustrating an example of the configuration of the electron beam writing apparatus 1.

The present embodiment is similar to the first and second embodiments in configuration of a writing mechanism 10, but includes a deflection operation control unit 305 configured to perform deflection operation control in a software portion 30, instead of the deflection operation control circuit 405 in the first and second embodiments described above.

As in the second embodiment, a high voltage power source 401, a magnetic field sensor 402, and a discharge detection control circuit 403 respectively transmit alarm signals AL1, AL2, and AL3 to a blanking control circuit 404.

The other configurations of a control mechanism 20 are similar to those of the first and second embodiments.

3.2 Writing Operations

Next, writing operations will be described. The flow of the writing operations is the same as that of the first embodiment.

Figure 12:
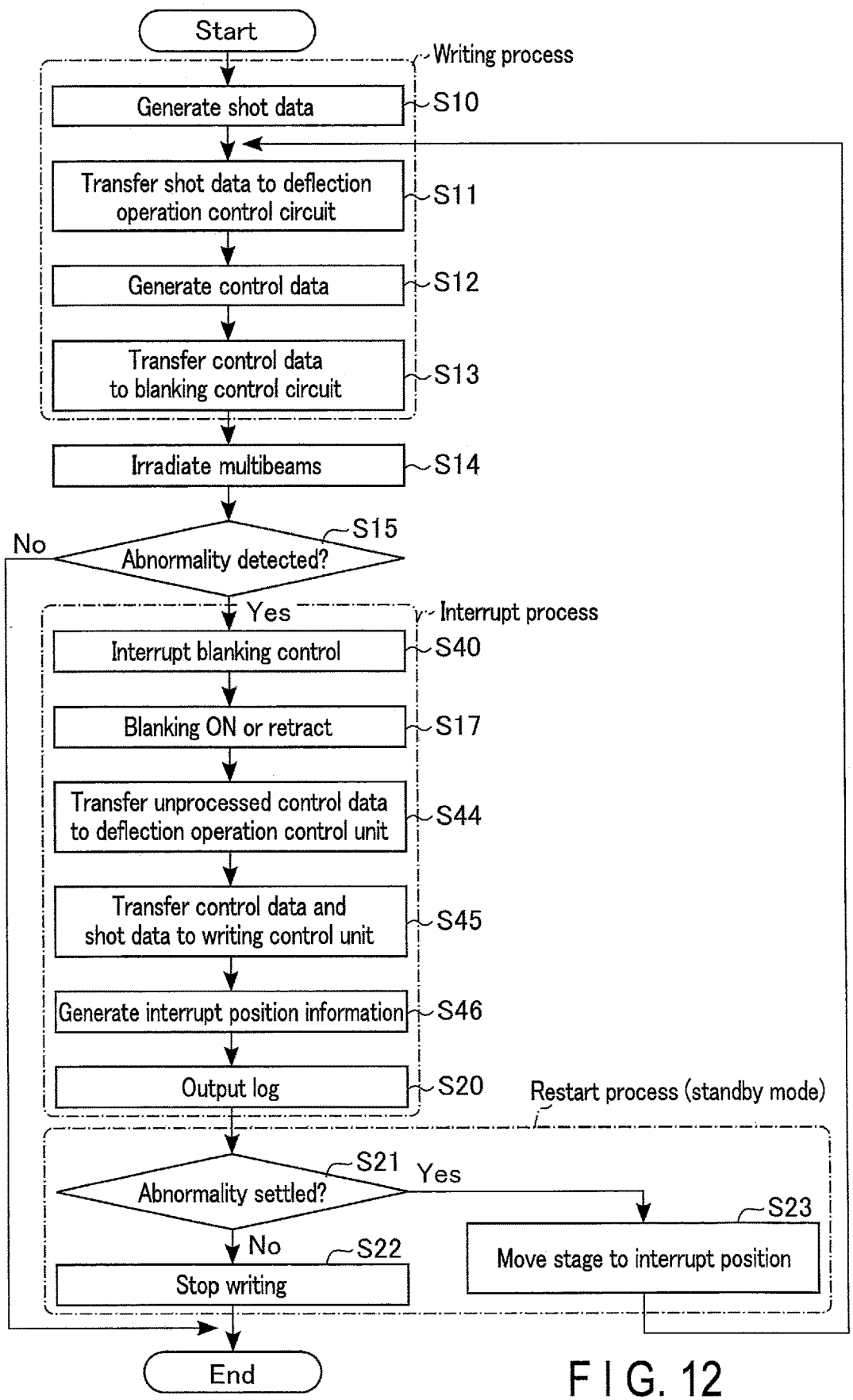
FIG. 12 is a flowchart showing a flow of writing operations in a case in which a standby mode is set in the charged particle beam writing apparatus according to the third embodiment.

In the following, writing operations when the standby mode is set will be explained with reference to FIG. 12. FIG. 12 is a flowchart showing an example of the writing operations when the standby mode is set.

As shown in FIG. 12, operations in steps S10 to S15 of the writing process are similar to those in the first embodiment shown in FIG. 6.

Upon detection of an abnormality (step S15_Yes), the blanking control circuit 404 that receives at least one of alarm signals AL1 to AL3 interrupts the blanking control (step S40). Then, the blanking control circuit 404 turns off the multibeams MB or retracts the sample 103 in the same manner as in the first embodiment (step S17). The blanking control circuit 404 transfers, to the deflection operation control unit 305, unprocessed control data contained therein which has not been used for the blanking control (step S44). The blanking control circuit 404 may transmit information on the abnormality detection to the deflection operation control unit 305.

The deflection operation control unit 305 transfers, to a writing control unit 303, unprocessed control data transferred from the blanking control circuit 404, and the shot ID of shot data for generating control data that will be transferred next to the blanking control circuit 404 unless the writing is interrupted, out of all unprocessed shot data that have not been used for generating control data (step S45). The writing control unit 303 generates interrupt position information based on the number of shot counts generated from the transferred unprocessed control data and the shot ID of the shot data (step S46).

The operations in step S20 to step S23 are similar to those in the first embodiment described with reference to FIG. 6.

3.3 Advantageous Effects of Present Embodiment

According to the present embodiment, the same effects as those of the second embodiment can be obtained.

4. Modifications, Etc

In the embodiments described above, a case in which the operation modes are set before the writing operations is described; however, the embodiments are not limited to this case. Two-stage determination levels may be set in the discharge detection control circuit 403, the high voltage power source 401, and the magnetic field sensor 402, so that the operation mode can be set in accordance with the determination level. More specifically, for example, if a measurement value of a current in the discharge detection control circuit 403 is equal to or greater than a first-stage determination level and less than a second-stage determination level, the standby mode (or the diagnosis mode) is selected. If the measurement value of the current is equal to or greater than the second-stage determination level, the stop mode is selected.

The present invention is not limited to the embodiments described above, and various modifications may be implemented without departing from the concept or scope of the present invention.

In the embodiments described above, descriptions for portions which are not directly necessary to explain the present invention, such as detailed configurations of devices and control methods, are omitted. However, it should be noted that the configurations of the devices and the control methods can be suitably selected and used if required. All inspection methods and inspection apparatuses that comprise the elements of the present invention and that can be suitably modified by a person ordinarily skilled in the art are encompassed in the scope of the present invention.

The invention claimed is:

1. A charged particle beam writing apparatus comprising:
a writing mechanism configured to irradiate a plurality of charged particle beams to a target for writing a pattern, while performing blanking of each of the charged particle beams;
a writing control circuit configured to control the writing mechanism based on shot data generated from the pattern;
a deflection operation control circuit configured to generate control data for controlling the blanking of each of the charged particle beams based on the shot data transferred from the writing control circuit;
a storage configured to store the shot data until writing based on the shot data is completed;
a blanking control circuit configured to control the blanking based on the control data transferred from the deflection operation control circuit; and
a detector configured to detect an abnormality,
wherein
the writing control circuit is configured to, when the detector detects the abnormality during the writing, interrupt the writing, and generate interrupt position information at a position where the writing is interrupted based on the shot data which has been stored at the storage and is related to the control data that has not been used for controlling the blanking.

2. The charged particle beam writing apparatus according to claim 1, wherein
the writing control circuit is configured to restart the writing based on the interrupt position information after the abnormality has been settled.

3. The charged particle beam writing apparatus according to claim 1, wherein
the blanking control circuit is configured to interrupt blanking control when the transfer of the control data from the deflection operation control circuit is interrupted.

4. The charged particle beam writing apparatus according to claim 1, wherein
the blanking control circuit is configured to, when the detector detects the abnormality during the writing, interrupt blanking control to interrupt the writing, and transfer the control data which has not been used for the blanking control to the writing control circuit, and the writing control circuit is configured to generate the interrupt position information based on the control data which has not been used for the blanking control.

5. The charged particle beam writing apparatus according to claim 1, wherein
the writing control circuit is configured to determine a restart of the writing based on at least one of a writing precision required for a sample, a standby time, and a result of a malfunction diagnosis.

6. The charged particle beam writing apparatus according to claim 5, wherein
the malfunction diagnosis includes at least one of a diagnosis based on writing data and a diagnosis based on a voltage measurement.

7. The charged particle beam writing apparatus according to claim 1, wherein
the storage is configured to store a shot ID tied to a writing position included in the shot data.

8. The charged particle beam writing apparatus according to claim 1, wherein
the writing control circuit includes an interrupt position information storage configured to store the interrupt position information.

9. A charged particle beam writing method for writing a pattern by irradiating a plurality of charged particle beams, while performing blanking of each of the charged particle beams, the method comprising:
generating shot data based on the pattern;
generating control data for blanking each of the charged particle beams based on the shot data;
storing the shot data based on which the control data has been generated, until writing based on the shot data is completed;
controlling the blanking based on the control data to perform writing; and
when detecting an abnormality during the writing,
interrupting the writing, and
generating interrupt position information at a position where the writing is interrupted based on the shot data which has been stored and is related to the control data that has not been used for controlling the blanking.

10. The charged particle beam writing method according to claim 9, further comprising restarting the writing based on the interrupt position information after the abnormality has been settled.

11. The charged particle beam writing method according to claim 9, wherein
the interrupting the writing includes:
interrupting transfer of the control data; and
interrupting the controlling the blanking.

12. The charged particle beam writing method according to claim 10, wherein
the restarting the writing includes determining a restart of the writing based on at least one of a writing precision required for a sample, a standby time, and a result of a malfunction diagnosis.

13. The charged particle beam writing method according to claim 9, wherein
the storing the shot data includes storing a shot ID tied to a writing position included in the shot data.

* * * * *